(12) United States Patent
Liao et al.

(10) Patent No.: US 10,916,307 B2
(45) Date of Patent: Feb. 9, 2021

(54) RESISTIVE MEMORY APPARATUS AND OPERATING METHOD THEREOF

(71) Applicant: Winbond Electronics Corp., Taichung (TW)

(72) Inventors: Shao-Ching Liao, Taichung (TW); Ping-Kun Wang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/726,206

(22) Filed: Dec. 23, 2019

(65) Prior Publication Data

US 2020/0350013 A1 Nov. 5, 2020

(30) Foreign Application Priority Data

May 3, 2019 (TW) .............................. 108115459 A

(51) Int. Cl.
*G11C 11/00* (2006.01)
*G11C 13/00* (2006.01)

(52) U.S. Cl.
CPC ........ *G11C 13/0069* (2013.01); *G11C 13/004* (2013.01); *G11C 13/0097* (2013.01);
(Continued)

(58) Field of Classification Search
CPC ............ G11C 13/0004; G11C 13/0069; G11C 13/004; G11C 2213/71; G11C 2013/0073; G11C 13/003; G11C 2013/0078; G11C 2013/0092; G11C 13/0002; G11C 13/0023; G11C 2213/72; G11C 2213/79; G11C 11/5678; G11C 13/0061; G11C 13/0007; H01L 45/1233; H01L 45/06; H01L 45/144; H01L 27/2409; H01L 27/2463; H01L 45/16; H01L 45/1253; H01L 45/146; H01L 27/2445; H01L 27/2481; H01L 45/12; H01L 27/2427; H01L 45/08; H01L 45/141; H01L 45/1608
USPC .... 365/148, 163, 189.15, 158, 211, 189.011, 365/189.06, 189.07, 210.1, 230.03, 136, 365/149, 171, 173, 185.11, 185.18, 365/189.04, 189.09
See application file for complete search history.

(56) References Cited

U.S. PATENT DOCUMENTS

| 6,188,615 B1 | 2/2001 | Perner et al. |
| 2014/0241034 A1 | 8/2014 | Tsai et al. |
| 2019/0206506 A1* | 7/2019 | Tortorelli ............. G11C 13/004 |

FOREIGN PATENT DOCUMENTS

| TW | 200522276 | 7/2005 |
| TW | 201101329 | 1/2011 |

OTHER PUBLICATIONS

"Office Action of Taiwan Counterpart Application," dated Aug. 8, 2019, p. 1-p. 5.

* cited by examiner

Primary Examiner — Thong Q Le
(74) Attorney, Agent, or Firm — JCIPRNET

(57) ABSTRACT

A resistive memory apparatus and an operating method thereof are provided. In the method, a set operation having a first enhanced bias is performed on at least one memory cell in a resistive memory array of the resistive memory apparatus, in which the first enhanced bias is larger than a bias used in a normal execution of the set operation. A heat process is performed on the memory cell. A set operation having a second enhanced bias is performed on the memory cell, in which the second enhanced bias is larger than or equal to the first enhanced bias.

12 Claims, 7 Drawing Sheets

(52) U.S. Cl.
CPC .................. *G11C 2013/008* (2013.01); *G11C 2013/0083* (2013.01)

RESISTIVE MEMORY APPARATUS AND OPERATING METHOD THEREOF

CROSS-REFERENCE TO RELATED APPLICATION

This application claims the priority benefit of Taiwan application serial no. 108115459, filed on May 3, 2019. The entirety of the above-mentioned patent application is hereby incorporated by reference herein and made a part of this specification.

BACKGROUND OF THE INVENTION

Field of the Invention

The invention relates to a memory apparatus and an operating method thereof, and particularly related to a resistive memory apparatus and an operating method thereof.

Description of Related Art

A non-volatile memory has the advantage that the deposited data do not disappear after the power is cut off. Therefore, it is a necessary memory element for many electronic products to maintain normal operations. Currently, a resistive random access memory (RRAM) is a type of nonvolatile memory that is being actively developed in the industry. RRAM has advantages such as low write operation voltage, short write erase time, long memorizing time, non-destructive read out, multi-state memory, simple structure, and small required area. Consequently, RRAM has great potential in the applications in personal computers and electronic apparatuses in the future.

Generally, a resistive memory may change its filament path according to the magnitude and the polarity of the applied pulse voltage. As such, the resistive memory may be reversibly and non-volatilely set as a low resistance state (LRS) or a high resistance state (HRS), so as to respectively represent stored data of different logic levels. As such, the data may be read according to the read current generated in different ranges under different resistance states.

RRAM memory cells have an increasing probability of failure after multiple operations. To avoid failure, the conventional method is to directly adjust the magnitude of the bias of the set operation. However, under the condition that the bias of the set operation is lowered, and a reset complementary switch (CS) occurs after multiple operations, and the bit error rate (BER) of the RESET operation is increased. In contrast, under the condition that the set operation voltage is enhanced, a soft error resulted by the sudden decrease of the set operation current as illustrated in the arrow of FIG. 1 after multiple operations. The set operation is thus unstable, and the bit error rate (BER) increases.

SUMMARY OF THE INVENTION

The invention provides a resistive memory apparatus and an operating method thereof, which enhances the endurance of the apparatus and reduces a bit error rate.

The invention provides an operating method of the resistive memory apparatus, which includes performing a set operation having a first enhanced bias on at least one memory cell in a resistive memory array of the resistive memory apparatus, in which the first enhanced bias is greater than a bias used in a normal execution of the set operation; performing a heat process on the memory cell; and performing a set operation having a second enhanced bias on the memory cell, in which the second enhanced bias is greater than or equal to the first enhanced bias.

The invention provides a resistive memory apparatus including a resistive memory cell array and a processor. The resistive memory array includes a plurality of memory cells. The processor is coupled to the resistive memory array and configured to perform a set operation having a first enhanced bias on at least one of the memory cells, in which the first enhanced bias is greater than a bias used in a normal execution of the set operation. Then, the processor performs a heat process on the memory cell. Afterwards, the processor performs a set operation having a second enhanced bias on the memory cell, in which the second enhanced bias is greater than or equal to the first enhanced bias.

Based on the above, in the resistive memory apparatus and the operating method thereof of the invention, by performing the set operation on the memory cell using an enhanced bias, the current distribution may be made wider at the time of performing the set operation. By performing a recovery operation such as heat process on the memory cell and performing the set operation on the memory cell using the enhanced bias again, the uniformity of the current distribution of the set operation can be improved. As a result, the purposes of enhancing the endurance and decreasing the bit error rate are reached.

To make the aforementioned more comprehensible, several embodiments accompanied with drawings are described in detail as follows.

DESCRIPTION OF THE EMBODIMENTS

Figure 1:
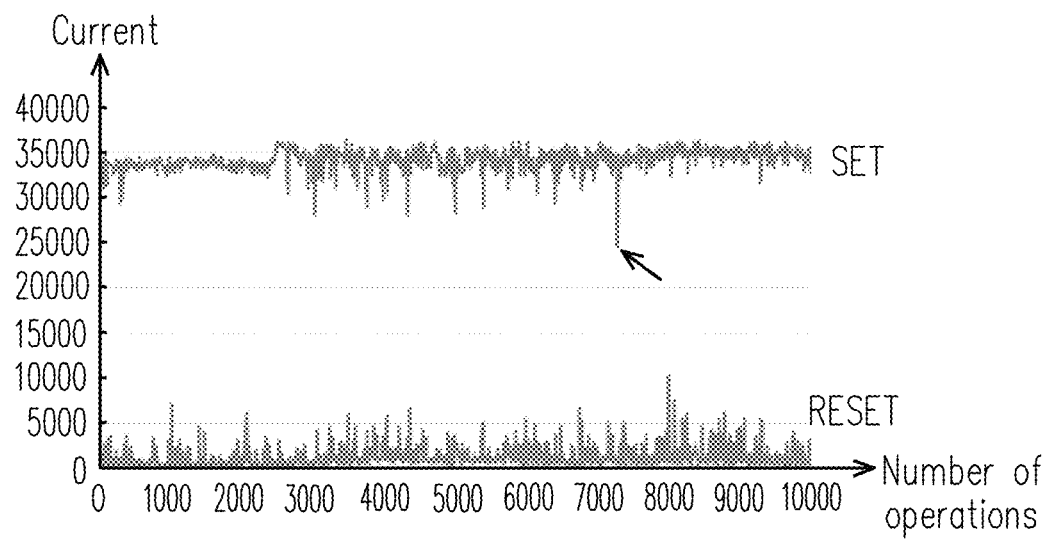
FIG. 1 is a read current distribution diagram generated by a conventional resistive memory apparatus performing a set operation and a reset operation.
Figure 2:
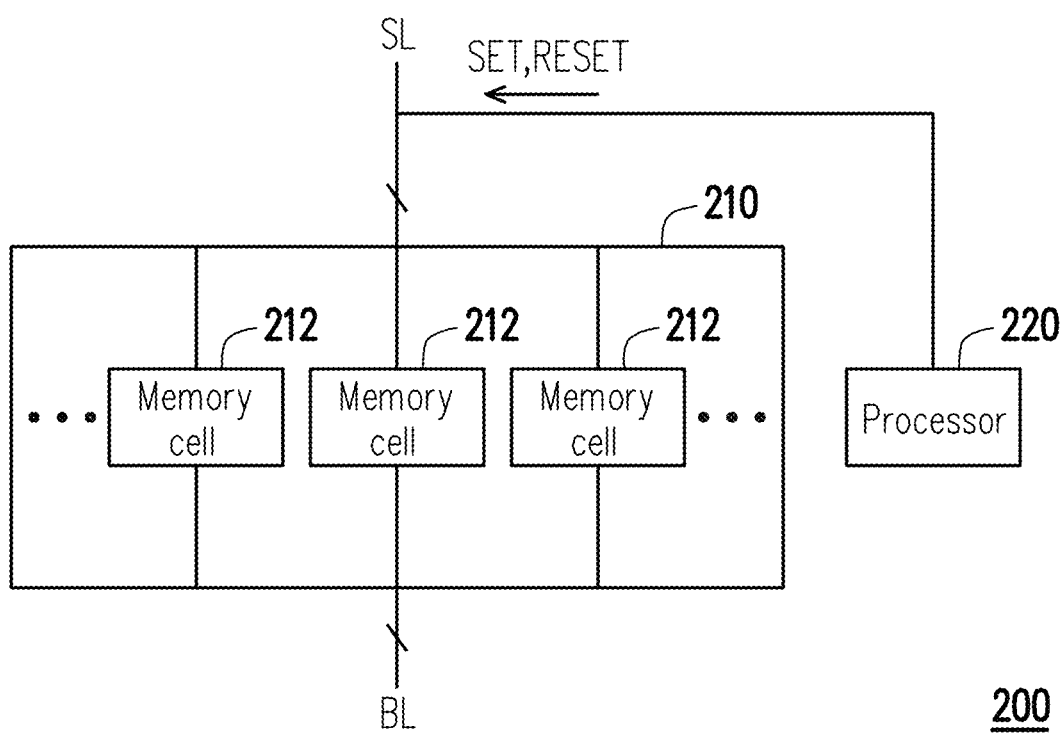
FIG. 2 is a schematic diagram of a resistive memory apparatus according to an embodiment of the present invention.

Referring to FIG. 2, a resistive memory apparatus 200 includes a resistive memory array 210 and a processor 220. The resistive memory array 210 includes a plurality of memory cells 212 respectively coupled to a source line SL and a bit line BL. The resistive memory array 210 is coupled to the processor 220 through the source line SL. Each of the memory cells 212 may include a switch element and a variable resistive element. Furthermore, each resistive memory cell 212 may provide a single bit of stored data.

The processor 220 is, for example, a central processing unit. The processor 220 is coupled to the resistive memory array 210, and configured to transmit a set pulse SET and a reset pulse RESET to the resistive memory array 210, so as to perform a data write operation on each of the memory cells 212.

As the endurance and the bit error rate of the resistive memory apparatus are affected by the bias used in its operation, in an exemplary embodiment of the present invention, when a set operation is performed on a memory cell of a resistive memory apparatus, a higher or lower bias are respectively applied and a recovery operation such as performing a heat process on the memory cell is interspersed therebetween. By observing the changes of the read current of the memory cell, an operating method having better uniformity without compromising performance is acquired.

Figure 3A:
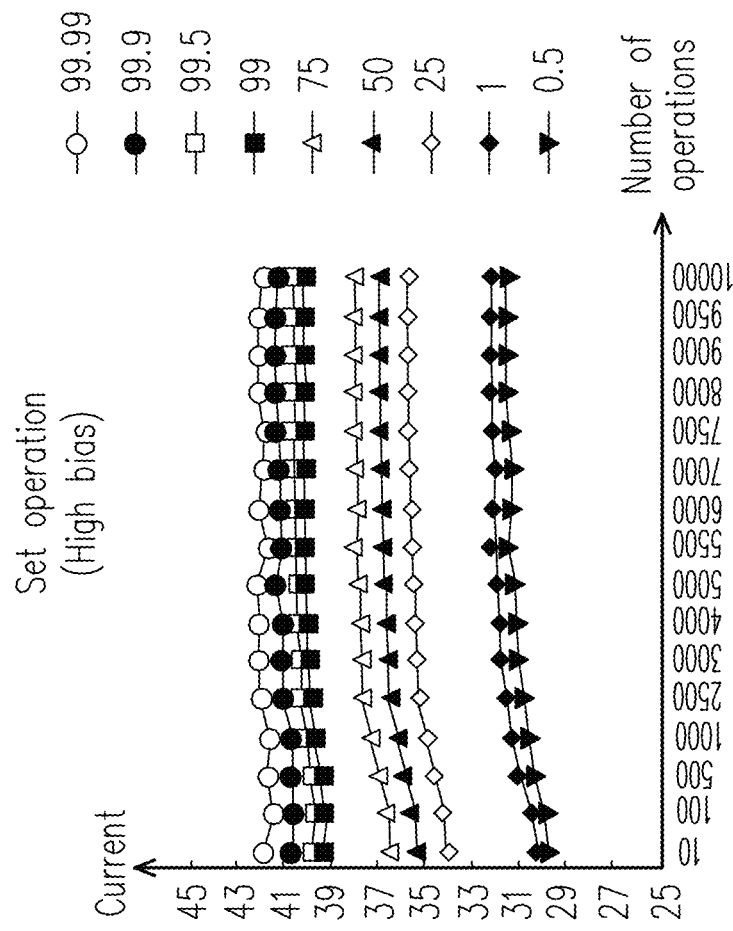
FIG. 3A to FIG. 3C are cumulative probability distributions of a read current of a resistive memory apparatus according to an embodiment of the present invention.
Figure 3C:
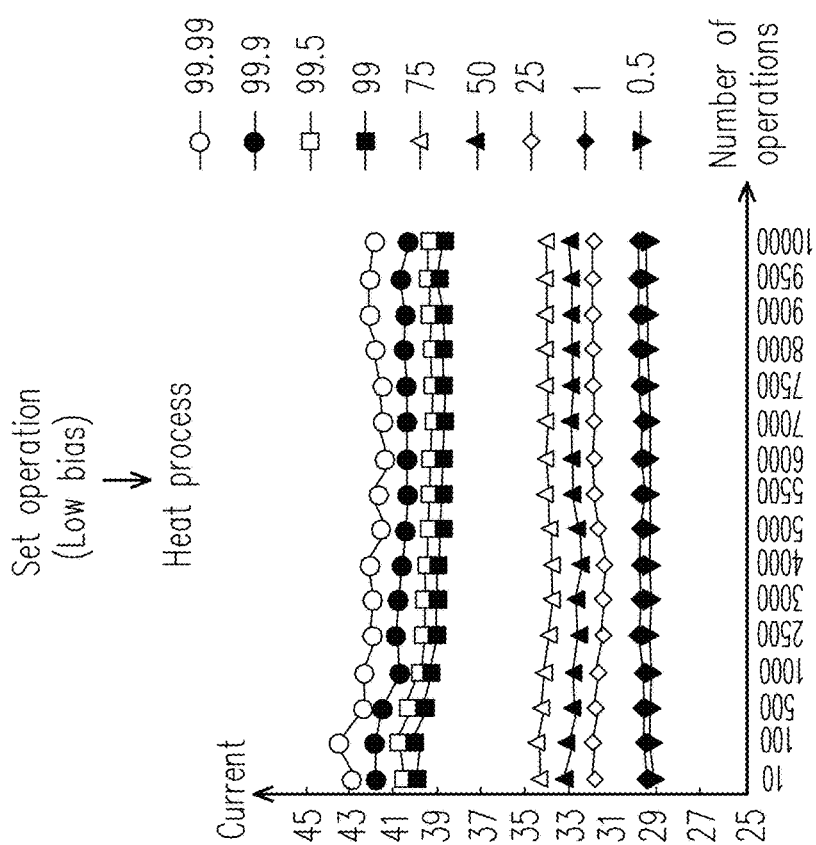
Figure 3B:
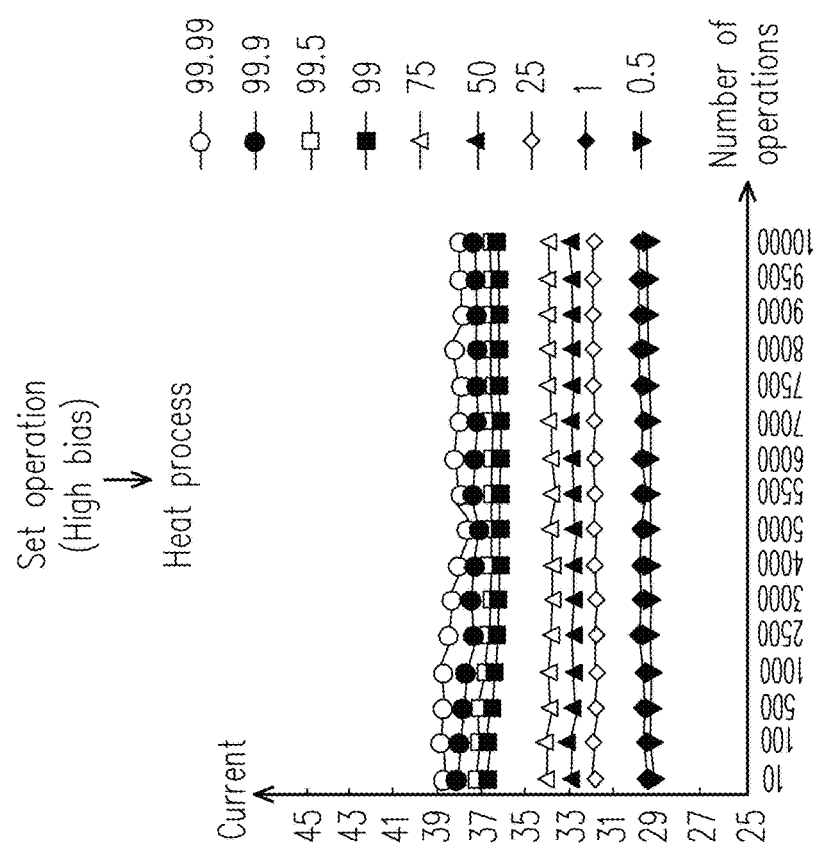

In detail, referring to FIG. 3A to FIG. 3C, where the horizontal axis represents the number of operations, and the vertical axis represents the read current. FIG. 3A illustrates a cumulative probability distribution of a read current generated when a set operation using a high bias is continuously performed on the memory cell of the resistive memory apparatus, wherein as the number of operations increases, the read current increases. FIG. 3B illustrates a cumulative probability distribution of a read current generated after a set operation using a high bias is first performed on the memory cell of the resistive memory apparatus and then a recovery operation is performed on the memory cell, wherein the read current decreases, which indicates the condition that a set CS may less likely occur. FIG. 3C illustrates a cumulative probability distribution of a read current generated after a set operation using a low bias is first performed on the memory cell of the resistive memory apparatus and then a recovery operation is performed on the memory cell, wherein the magnitude of the read current does not decrease and is roughly the same as FIG. 3A. It may be acquired by the results of the aforementioned FIG. 3A to FIG. 3C that the effect of decrease in the read current may be acquired by performing the set operation using the high bias and then performing the recovery operation. Therefore, the embodiment of the invention applies this operation as one of the necessary elements of the method for operating the resistive memory apparatus.

Figures 4A, 4B:
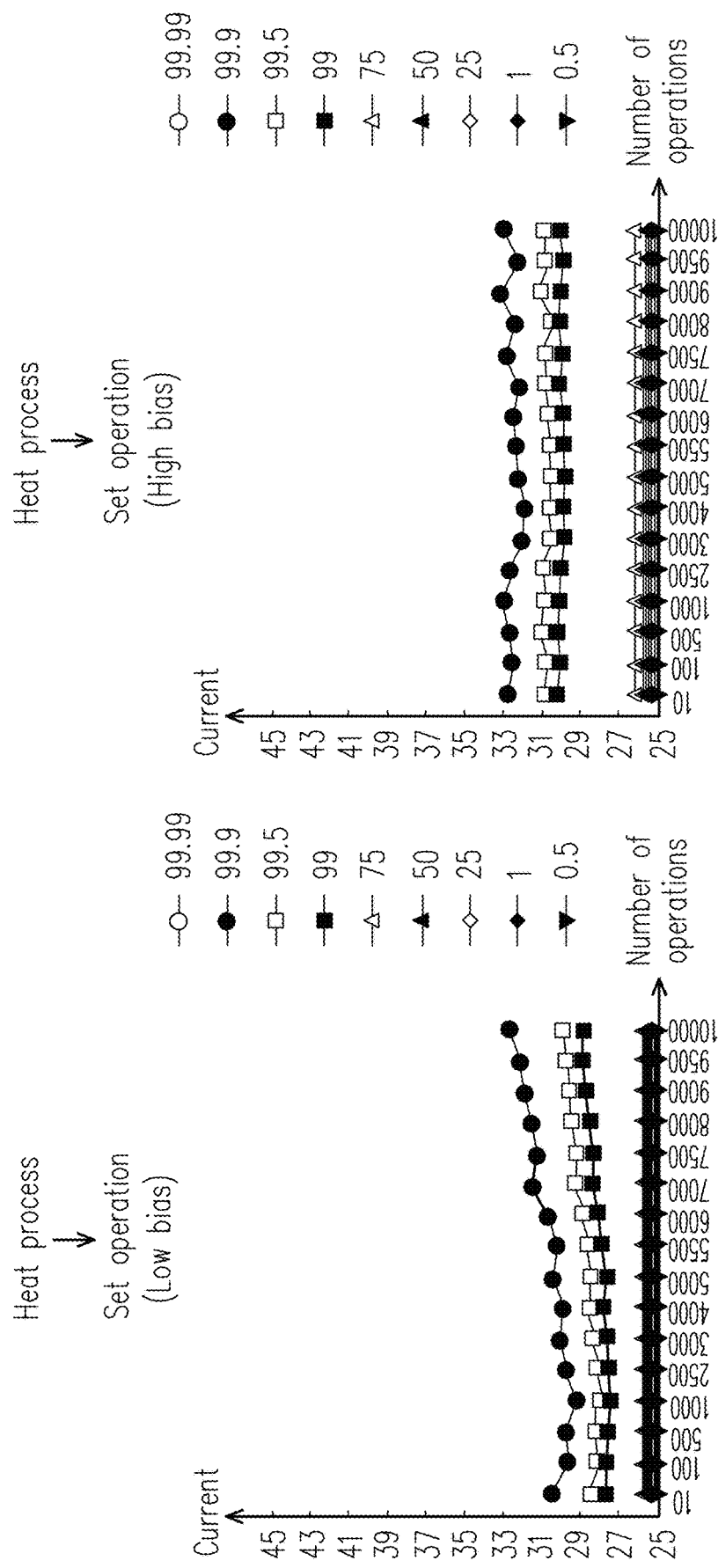
FIG. 4A and FIG. 4B are cumulative probability distributions of a read current of a resistive memory apparatus according to an embodiment of the present invention.

On the other hand, referring to FIG. 4A and FIG. 4B, where the horizontal axis represents the number of operations, and the vertical axis represents the read current. FIG. 4A illustrates a cumulative probability distribution of a read current generated when a set operation using a low bias is performed on the memory cell of the resistive memory apparatus, wherein the read current is changed from decreasing to increasing, which indicates a reset CS may occur. FIG. 4B illustrates a cumulative probability distribution of a read current generated when a recovery operation is performed on the memory cell of the resistive memory apparatus and then a set operation using a high bias is performed, wherein the read current is stable. Therefore, the embodiment of the invention applies this operation as one of the necessary elements of the method for operating the resistive memory apparatus.

Based on the aforementioned observations, the embodiment of the invention combines the aforementioned two necessary elements to improve the uniformity of the current distribution during the set operation.

Figure 5:
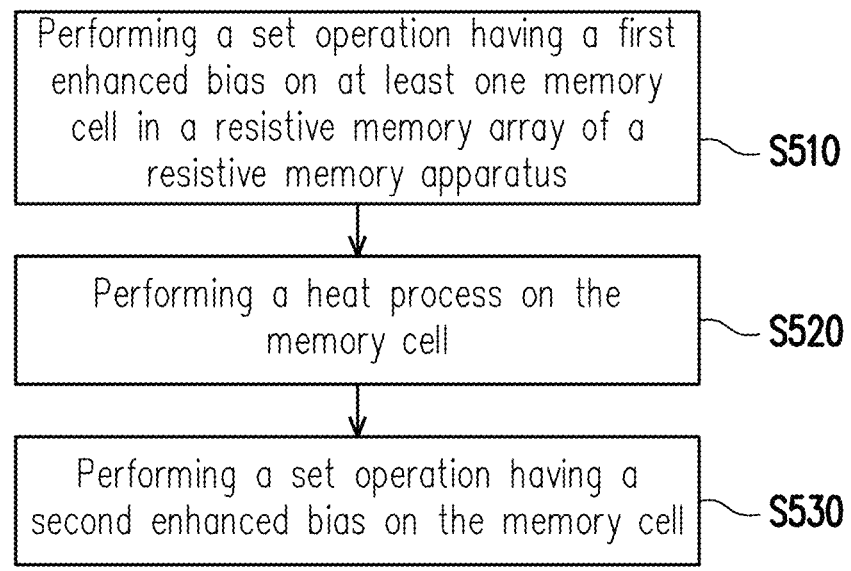
FIG. 5 is a flowchart of an operating method of a resistive memory apparatus according to another embodiment of the present invention.

Referring to FIG. 2 and FIG. 5 at the same time, the operating method of this embodiment is applied to the resistive memory apparatus 200 of FIG. 2. Each step of the operating method of the embodiment of the present invention is described below with each component in the resistive memory apparatus 200.

In Step S510, the processor 220 performs a set operation having a first enhanced bias on at least one memory cell 212 in the resistive memory array 210 of the resistive memory apparatus 200. The first enhanced bias is greater than the bias used in a normal execution of the set operation, and is, for example, 10% to 35% higher than the normal bias. However, the invention is not limited thereto.

In Step S520, the processor 220 performs a heat process on the aforementioned memory cell 212. The processor 220 performs, for example, a series of operations on the memory cell 212 to generate Joule heat, such that the memory cell 212 may be recovered back to the stable state. In an embodiment, the processor 220 performs the heat process by a manner of low bias and a long pulse. That is, the processor 220 performs a set operation on the memory cell 212 by using a bias lower than a bias used in the normal operation and a pulse longer than a pulse used in the normal operation. In an embodiment, the processor 220 performs the heat process by continuously transmitting a plurality of short pulses. That is, the processor 220 performs the set operation on the memory cell 212 by using a pulse higher than the pulse used in the normal operation.

In Step S530, the processor 220 performs a set operation having the second enhanced bias on the memory cell 212. The second enhanced bias is greater than or equal to the aforementioned first enhanced bias. In an embodiment, the second enhanced bias is 5% to 20% greater than the first enhanced bias.

With the aforementioned method, the embodiment of the invention may effectively increase the overall endurance of the resistive memory apparatus, and decrease the bit error rate.

In some embodiments, before performing the aforementioned set operation having the enhanced bias, the variation of the read current generated when performing a reset operation on the memory cell may be analyzed to determine whether to adjust the bias used in performing the set operation and the magnitude to be adjusted, thereby acquiring the magnitude of the enhanced bias applicable to perform the set operation.

Figure 6:
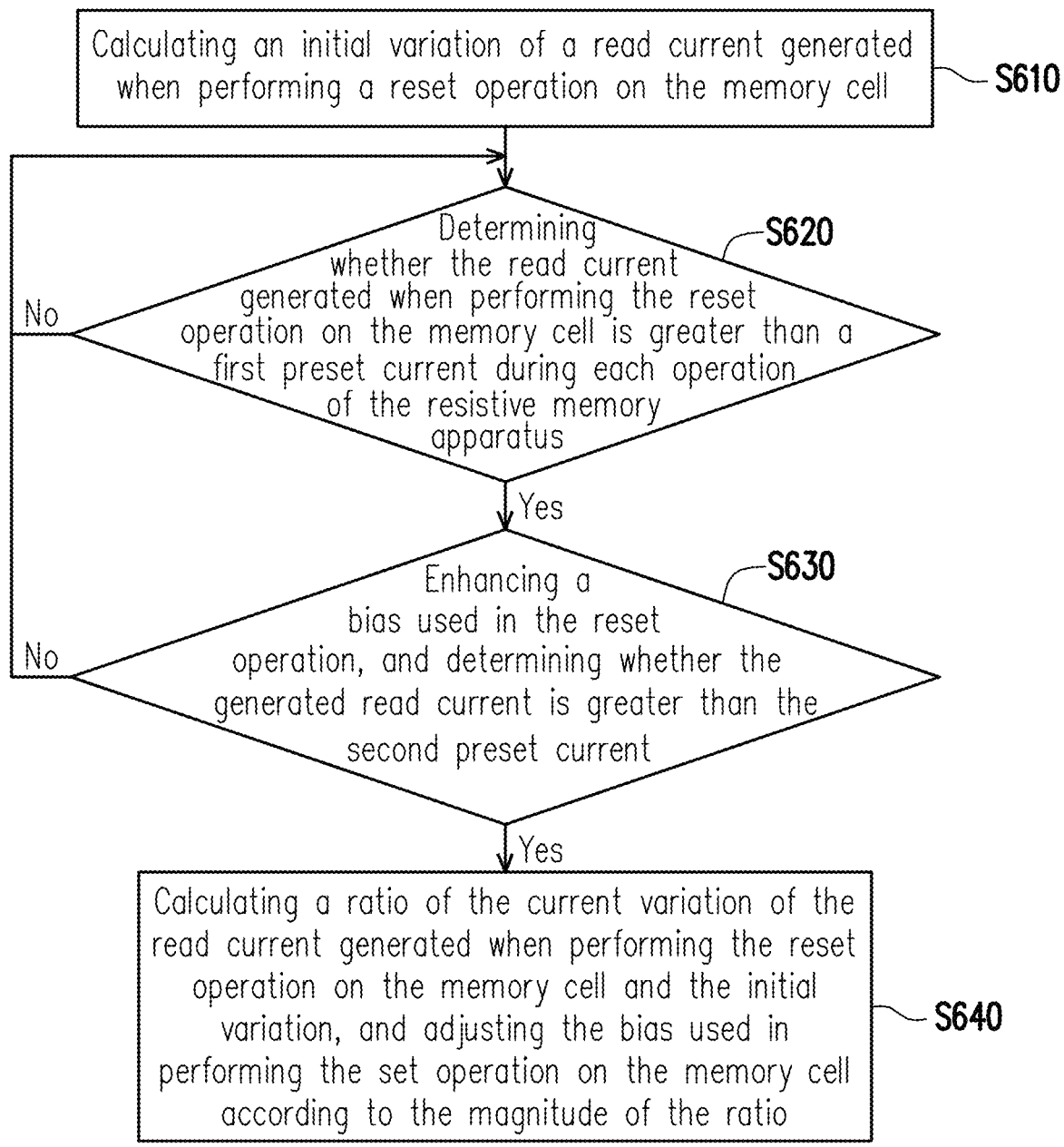
FIG. 6 is a flowchart of an operating method of a resistive memory apparatus according to another embodiment of the present invention.

Referring to FIG. 2 and FIG. 6 at the same time, the operating method of this embodiment is applicable to the resistive memory apparatus 200 of FIG. 2. Each step of the operating method of the embodiment of the present invention is described below with each component in the resistive memory apparatus 200.

In Step S610, the processor 220 calculates an initial variation of the read current generated when performing the reset operation on the memory cell 212. The variation is, for example, an average, a variance, a standard deviation, or other statistic values for evaluating the degree of value variation, which is not limited thereto.

In Step S620, the processor 220 determines whether the read current generated when performing the reset operation on the memory cell 212 is greater than a first preset current during each operation of the resistive memory apparatus. If the read current is not greater than the first preset current, the processor 220 performs a next operation and re-performs the determination of Step S620.

If the read current is greater than the first preset current, in Step S630, the processor 220, for example, performs a ramp operation to enhance the bias used in the reset operation, and determines whether the generated read current is greater than the second preset current. If the first preset current is not greater than the second preset current, the processor 220 also performs the next operation, and reperforms the determination of Step S620. The aforementioned second preset current is, for example, greater than the first preset current. In an embodiment, the first preset current is, for example, 3 mA, and the second preset current is, for example, 10 mA, but the embodiment is not limited thereto.

If the first preset current is greater than the second preset current, in Step S640, the processor 220 calculates a ratio of the current variation of the read current generated when performing the reset operation on the memory cell 212 and the initial variation, and adjusts the bias used in performing the set operation on the memory cell 212 according to the magnitude of the ratio. In an embodiment, the processor 220, for example, sets two threshold values for the ratio of this variation, so as to determine whether to increase, decrease, or no longer adjust the bias used in the set operation.

Figure 7:
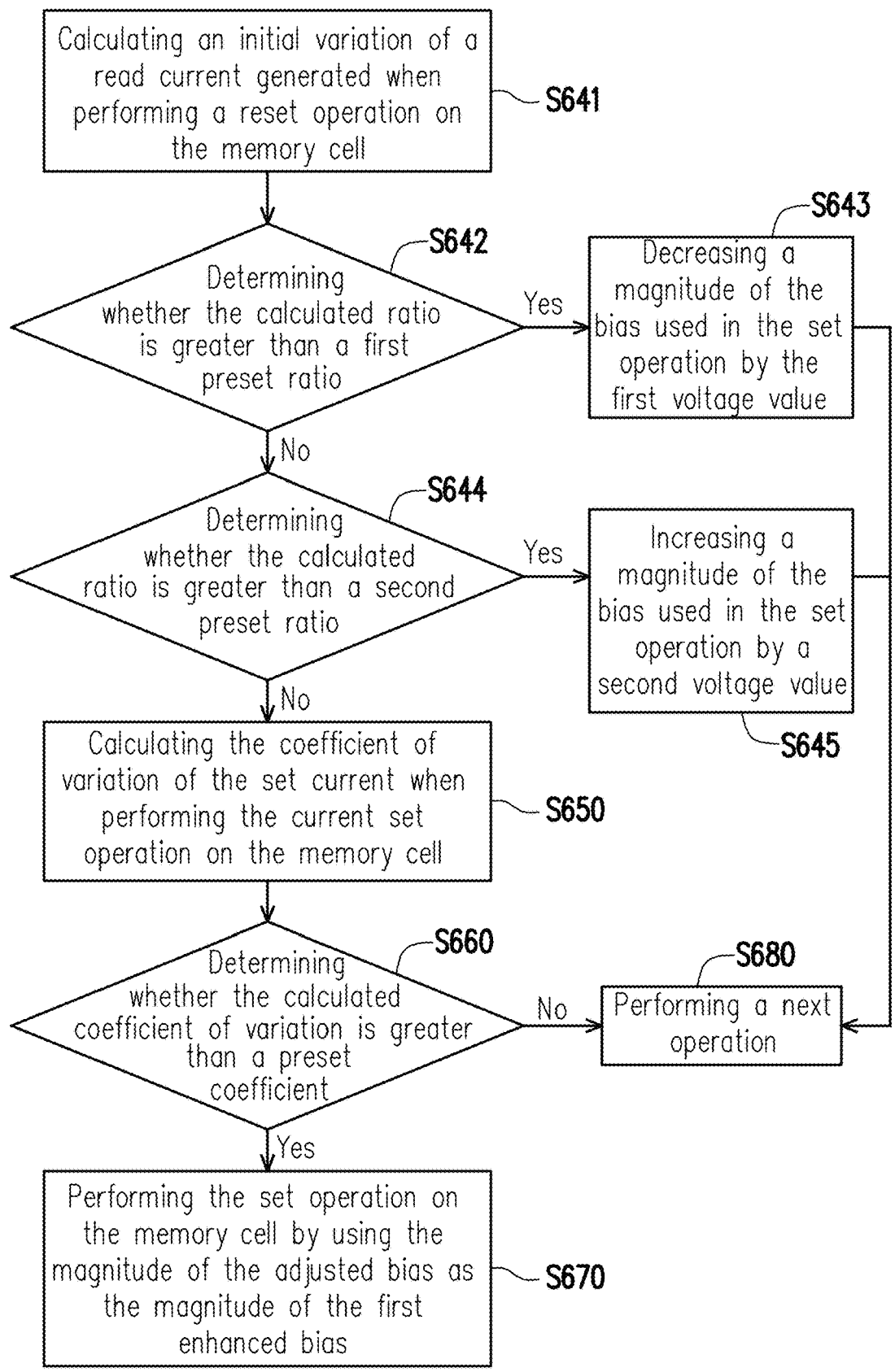
FIG. 7 is a flowchart of an operating method of a resistive memory apparatus according to another embodiment of the present invention.

Referring to FIG. 2, FIG. 6, and FIG. 7, the operating method of this embodiment discloses the detailed process and the subsequent process of Step S640 of FIG. 6. Each step of the operating method of the embodiment of the present invention is described below with each component in the resistive memory apparatus 200.

In Step S641, the processor 220 calculates the initial variation of the read current generated when performing a reset operation on the memory cell 212.

In Step S642, the processor 220 determines whether the calculated ratio is greater than the first preset ratio. If the calculated ratio is greater than the first preset ratio, in Step S643, the processor 220 decreases a magnitude of the bias used in the set operation by a first voltage value. In addition, in Step S680, the processor 220 performs the next operation.

If the calculated ratio is not greater than the first preset ratio, in Step S644, the processor 220 determines whether the calculated ratio is greater than a second preset ratio. If the calculated ratio is greater than the second preset ratio, in Step S645, the processor 220 increases a magnitude of the bias used in the set operation by the second voltage value. In addition, in Step S680, the processor 220 performs the next operation. The second voltage value is smaller than the aforementioned first voltage value. In an embodiment, the second voltage value is, for example, one third of the first voltage value, but the invention is not limited thereto.

Through adjusting the bias used in the set operation by the above method and using different adjustment values when increasing and decreasing the bias, the variation of the read current generated when performing the reset operation is decreased, such that the distribution of the read current generated during the set operation is subsequently adjusted.

On the other hand, if in Step S644, the processor 220 determines the calculated ratio is not greater than the second preset ratio, in Step S650, the processor 220 calculates the coefficient of variation of the set current when performing the set operation on the memory cell 212. In addition, in Step S660, the processor 220 determines whether the calculated coefficient of variation is greater than the preset coefficient. The preset coefficient is, for example, any value between 0.05 and 0.1.

If the calculated coefficient of variation is not greater than the preset coefficient, in Step S680, the processor 220 performs the next operation. On the contrary, if the calculated coefficient of variation is greater than the preset coefficient, in Step S670, the processor 220 performs the set operation on the memory cell 212 by using the magnitude of the adjusted bias as the magnitude of the first enhanced bias.

By reducing the variation of the read current generated when performing the set operation with the above method, the procedure of FIG. 5 may be performed by using the appropriately adjusted enhanced bias, so as to achieve the purposes of enhancing the endurance and decreasing the bit error rate.

In view of the above, in the embodiments of the invention, by analyzing the variation of the read current when performing the reset operation, the enhanced bias suitable for performing the set operation may be determined. Through performing the set operation using the enhanced bias on the memory cell, the read current distribution may be made wider when performing the set operation. Through performing a recovery operation such as the heat process on the memory cell and performing the set operation on the memory cell again by using the enhanced bias, the uniformity of the current distribution in the set operation is improved without affecting the current distribution of the reset operation, and the overall endurance of the resistive memory apparatus is thus enhanced and the bit error rate is decreased.

Although the invention is disclosed as the embodiments above, the embodiments are not meant to limit the invention. Any person skilled in the art may make slight modifications and variations without departing from the spirit and scope of the invention. Therefore, the protection scope of the invention shall be defined by the claims attached below.

What is claimed is:

1. An operating method of a resistive memory apparatus, the method comprising the following steps:
    performing a set operation having a first enhanced bias on at least one memory cell of the resistive memory apparatus, wherein the first enhanced bias is greater than a bias used in a normal execution of the set operation;
    performing a heat process on the memory cell after performing the set operation having the first enhanced bias; and
    performing a set operation having a second enhanced bias on the memory cell after performing the heat process, wherein the second enhanced bias is greater than or equal to the first enhanced bias.

2. The method according to claim 1, wherein before the step of performing the set operation having the first enhanced bias on the memory cell, the method further comprises:
    calculating an initial variation of a read current generated when performing a reset operation on the memory cell;
    determining whether the read current generated when performing the reset operation on the memory cell is greater than a first preset current during each operation of the resistive memory apparatus;
    performing a next operation if the read current is not greater than the first preset current, and redetermining whether the read current generated when performing the reset operation on the memory cell is greater than the first preset current;
    enhancing a bias used in the reset operation if the read current is greater than the first preset current, and determining whether the read current is greater than the second preset current, wherein the second preset current is greater than the first preset current;
    performing the next operation if the read current is not greater than the second preset current, and redetermining whether the read current generated when performing the reset operation on the memory cell is greater than the first preset current; and
    calculating a ratio of a current variation of the read current generated when performing the reset operation on the memory cell and the initial variation if the read current is greater than the second preset current, and adjusting the bias used in performing the set operation on the memory cell according to the magnitude of the ratio.

3. The method according to claim 1, wherein the step of adjusting the bias used in performing the set operation on the memory cell according to the magnitude of the ratio comprises:
decreasing a magnitude of the bias used in the set operation by a first voltage value if the ratio is greater than a first preset ratio; and
increasing a magnitude of the bias used in the set operation by a second voltage value if the ratio is not greater than the first preset ratio and is greater than a second preset ratio, wherein the second preset ratio is smaller than the first preset ratio, and the second voltage value is smaller than the first voltage value.

4. The method according to claim 3, further comprising:
determining whether a coefficient of variation of the set current when performing the set operation on the memory cell is greater than a preset coefficient if the ratio is not greater than the second preset ratio; and
performing the set operation on the memory cell by using a magnitude of an adjusted bias as a magnitude of the first enhanced bias if the coefficient of variation is greater than the preset coefficient.

5. The method according to claim 1, wherein the step of performing the heat process on the memory cell comprises:
performing the set operation on the memory cell by using a bias lower than a bias used in a normal operation and a pulse longer than a pulse length used in a normal operation.

6. The method according to claim 1, wherein the step of performing the heat process on the memory cell comprises:
performing the set operation on the memory cell by using a pulse having a pulse frequency higher than a pulse used in a normal operation.

7. A resistive memory apparatus, comprising:
a resistive memory array, comprising a plurality of memory cells; and
a processor, coupled to the memory cells in the resistive memory array, and configured to:
perform a set operation having a first enhanced bias on at least one of the memory cells, wherein the first enhanced bias is greater than a bias used in a normal execution of the set operation;
perform a heat process on the memory cell after performing the set operation having the first enhanced bias; and
perform a set operation having a second enhanced bias on the memory cell after performing the heat process, wherein the second enhanced bias is greater than or equal to the first enhanced bias.

8. The resistive memory apparatus according to claim 7, wherein the processor is further configured to calculate an initial variation of a read current generated in a reset operation on the memory cell, and during each operation of the resistive memory apparatus, determine whether the read current generated when performing a reset operation on the memory cell is greater than a first preset current, wherein
a next operation is performed if the read current is not greater than the first preset current, and whether the read current generated when performing the reset operation on the memory cell is greater than the first preset current is redetermined;
the processor further enhances a bias used in the reset operation if the read current is greater than the first preset current, and determines whether the read current is greater than the second preset current, wherein the second preset current is greater than the first preset current;
the next operation is performed if the read current is not greater than the second preset current, and whether the read current generated when performing the reset operation on the memory cell is greater than the first preset current is redetermined; and
the processor further calculates a ratio of a current variation of the read current generated when performing the reset operation on the memory cell and the initial variation if the read current is greater than the second preset current, and adjusts the bias used in performing the set operation on the memory cell according to the magnitude of the ratio.

9. The resistive memory apparatus according to claim 8, wherein
the processor comprises decreasing a magnitude of the bias used in the set operation by a first voltage value if the ratio is greater than the first preset ratio; and
the processor comprises increasing a magnitude of the bias used in the set operation by a second voltage value if the ratio is not greater than the first preset ratio and is greater than the second preset ratio, wherein the second preset ratio is smaller than the first preset ratio and the second voltage is smaller than the first voltage.

10. The resistive memory apparatus according to claim 9, wherein
the processor further determines whether a coefficient of variation of the set current when performing the reset operation on the memory cell is greater than a preset coefficient if the ratio is not greater than the second preset ratio; and
the processor performs the set operation on the memory cell by using a magnitude of the adjusted bias as a magnitude of the first enhanced bias if the coefficient of variation is greater than the preset coefficient.

11. The resistive memory apparatus according to claim 7, wherein the processor comprises performing the set operation on the memory cell by using a bias lower than a bias used in a normal operation and a pulse longer than a pulse used in a normal operation.

12. The resistive memory apparatus according to claim 7, wherein the processor comprises performing the set operation on the memory cell by using a pulse having a pulse frequency higher than a pulse used in a normal operation.

* * * * *